United States Patent [19]

Alder et al.

[11] Patent Number: 5,572,167

[45] Date of Patent: Nov. 5, 1996

[54] METHOD AND APPARATUS FOR A PHASE-LOCKED LOOP CIRCUIT WITH HOLDOVER MODE

[75] Inventors: John M. Alder, Den Bosch; Hendricus M. H. Bontekoe, Huizen, both of Netherlands

[73] Assignee: Lucent Technologies Inc., Murray Hill, N.J.

[21] Appl. No.: 509,613

[22] Filed: Jul. 31, 1995

Related U.S. Application Data

[63] Continuation of Ser. No. 147,631, Nov. 5, 1993, abandoned.

[51] Int. Cl.$^6$ ........................................................ H03L 7/07
[52] U.S. Cl. ................. 331/2; 331/1 A; 331/25; 331/14; 331/17; 331/49; 327/156; 327/159; 375/376
[58] Field of Search .................... 331/1 A, 2, 16, 331/49, 18, 14, 25, 17; 375/376; 327/156, 159, 147, 150

[56] References Cited

U.S. PATENT DOCUMENTS

| | | | |
|---|---|---|---|
| 4,297,649 | 10/1981 | Sbuelz et al. | 331/2 |
| 4,388,597 | 6/1983 | Bickley et al. | 331/2 |
| 4,639,680 | 1/1987 | Nelson | 328/134 |
| 4,694,327 | 9/1987 | Demmer et al. | 348/508 |
| 4,864,253 | 9/1989 | Zwack | 331/1 A |
| 4,953,185 | 8/1990 | Goode | 375/106 |
| 4,972,442 | 11/1990 | Steierman | 375/108 |
| 4,980,899 | 12/1990 | Troost et al. | 375/108 |
| 5,111,151 | 5/1992 | Ii | 328/155 |
| 5,122,677 | 6/1992 | Sato | 331/49 X |
| 5,140,284 | 8/1992 | Petersson et al. | 331/25 |
| 5,159,292 | 10/1992 | Canfield et al. | 331/1 A |
| 5,184,350 | 2/1993 | Dara | 331/49 X |
| 5,239,561 | 8/1993 | Wong et al. | 375/81 |
| 5,260,979 | 11/1993 | Parker et al. | 331/25 X |
| 5,353,311 | 10/1994 | Hirata et al. | 327/156 |

FOREIGN PATENT DOCUMENTS

| | | |
|---|---|---|
| 0067053 | 12/1982 | European Pat. Off. |
| 0479237A1 | 4/1992 | European Pat. Off. |
| 0509706A2 | 10/1992 | European Pat. Off. |
| 2675972 | 10/1992 | France |

*Primary Examiner*—Robert Pascal
*Assistant Examiner*—Arnold Kinkead
*Attorney, Agent, or Firm*—Robert E. Rudnick

[57] ABSTRACT

A phase-looked loop circuit with holdover mode is formed utilizing a primary and secondary phase-locked loop circuits. Each loop circuit comprises a phase detector, loop filter, VCXO and frequency divider. The secondary loop is configured such that its output is very stable. The primary loop is phase-locked on a received reference clock signal and the second loop is phase locked on the output of the primary loop. The scaled output of the secondary loop being parallel to the reference clock signal. If the incoming reference signal is interrupted or lost the circuit is switched to a holdover mode where the input of the primary loop is switched to the stable scaled output of the secondary loop. In holdover mode, the output of the primary loop is phase-looked to the stable output of the secondary loop. When the reference clock signal is reestablished, the input of the primary loop is switched back to the reference clock signal.

25 Claims, 6 Drawing Sheets

METHOD AND APPARATUS FOR A PHASE-LOCKED LOOP CIRCUIT WITH HOLDOVER MODE

This application is a continuation of application Ser. No. 08/147,631, filed on Nov. 5, 1993, and now abandoned.

FIELD OF THE INVENTION

The invention relates generally to frequency synthesizers and electronic timing apparatus and methods, and more specifically to phase-locked loop circuits.

BACKGROUND OF THE INVENTION

Phase-locked loop ("PLL") circuits have been used for many years and are electronic circuits for locking an oscillator in phase with a reference signal. PLL circuits are often utilized within receivers in digital communication systems for the purpose of generating a local clock signal which is phase aligned with an incoming reference signal. The phase aligned local clock signal facilitates the receipt and processing of synchronous data sent by a transmitter in the communication system.

A conventional PLL circuit comprises a phase detector, a filter and a voltage-controlled oscillator ("VCO"). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

A potential problem exists for a PLL circuit used to generate a local clock signal for synchronous reading of a transmitted information stream, when the incoming reference signal is lost or interrupted. The output frequency of the VCO may drift during the absence of the reference signal, potentially causing a receiver to read data in the received information stream out of synchronization.

Several prior art techniques have been devised to provide an in-phase local clock signal during the period of absence or interruption of an incoming reference signal. U.S. Pat. No. 4,972,422 to Steierman, issued on Nov. 20, 1990, described a PLL circuit utilizing multiple reference signals. This prior art circuit can detect a loss of the incoming reference signal and transparently switch over to one of the other reference signals. A disadvantage of the circuit of U.S. Pat. No. 4,972,422 is that it is not applicable to communication systems having a single reference signal.

Another prior art technique utilizes a PLL having a voltage-controlled oscillator which employs a crystal maintained at a constant temperature so that a phase-locked clock signal having minimal drift is provided. A disadvantage of this prior art technique is the high power consumption required to maintain the crystal at the constant temperature.

It is desirable to have a PLL scheme with switchover that could substantially maintain a phase-locked signal upon an absence or interruption of the reference signal. Further, it is desirable that such circuits be of minimal complexity, have low power consumption and utilize inexpensive off the shelf components.

SUMMARY OF INVENTION

The present invention comprises a frequency synthesizer of the PLL type relying on a single incoming reference signal which can switch to a holdover mode upon an interruption of the reference signal. The frequency synthesizer utilizes two phase-locked loop circuits, a primary loop circuit which operates in the conventional manner when a received reference signal is present and a very stable secondary loop circuit which drives the primary loop circuit when the reference signal is faulty or absent. A switch connects the input of the primary loop circuit to the incoming reference signal or the output of the secondary loop circuit upon interruption of the reference signal.

An advantage of the present invention is low power consumption. Another advantage of the present invention is that it can be constructed of inexpensive off the shelf components which are available on most semiconductor gate arrays. Yet another advantage of the invention is that constant temperature voltage controlled crystal oscillators or multiple system reference signals are not needed.

DETAILED DESCRIPTION

Figure 1:
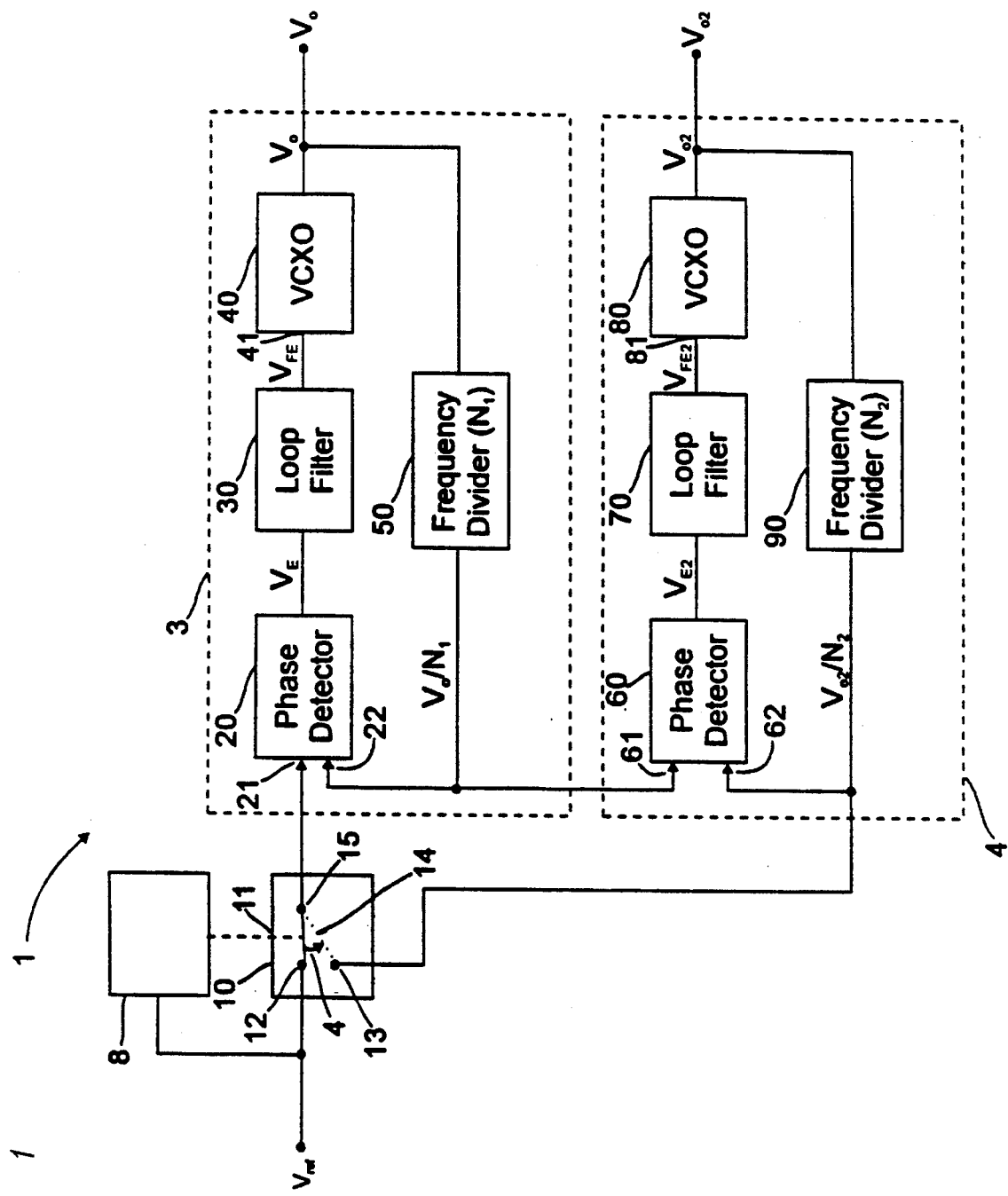
FIG. 1 is a schematic diagram of a phase-locked loop circuit in accordance with the present invention.

A PLL circuit 1 with holdover mode according to one embodiment of the present invention is illustrated in FIG. 1. An incoming reference signal $V_{ref}$ having a frequency $f_{ref}$ is applied to a signal sensing circuit 8 and a first pole 12 of a controllable switch 10. The signal sensing circuit 8 is further connected to a control input 11 of the switch 10. In operation, signal sensing circuit 8 causes switch 10 to operate in a first position shown in FIG. 1 as a solid line connecting the pole 12 to pole 15, or a second position shown by shadow line 14 connecting pole 13 to pole 15. A suitable device for use as controllable switch 10 is a conventional relay switch.

When in the first position, controllable switch 10 connects the incoming reference signal $V_{ref}$ to an input 21 of a phase detector 20. Phase detector 20 generates an output signal $V_E$ which is fed to a loop filter 30 which has its output connected to a control terminal 41 of a governable oscillator 40. A suitable device for governable oscillator 40 is a conventional voltage-controlled crystal oscillator ("VCXO"). The governable oscillator 40 generates an output signal $V_o$ having a frequency $f_o$ which is the output signal of PLL circuit 1. The output signal $V_o$ may be suitably used as a local clock signal for a receiver in a telecommunications network. The output signal $V_o$ of governable oscillator 40 is also scaled using a frequency divider 50 which divides the frequency $f_0$ by $N_1$. The scaled output signal $V_o/N_1$ produced at the output of the frequency divider 50 is fed back to an input 22 of the phase detector 20.

The scaled frequency divider output signal $V_o/N_1$ is also fed to an input 61 of a phase detector 60. Phase detector 60 generates an output signal $V_{E2}$ which is fed into a loop filter 70 which is connected to a control terminal 81 of a second governable oscillator 80. A VCXO is also a suitable device for the governable oscillator 80. The governable oscillator 80 generates an output signal $V_{o2}$ which may be suitably used as a second local clock signal in the host system in which circuit 1 is used. The output signal $V_{o2}$ is also applied to a frequency divider 90 which divides the frequency of $V_{o2}$ by $N_2$. The scaled output signal $V_{o2}/N_2$ of frequency divider 90 is fed back to a second input 62 of the phase detector 60 and to the pole 13 of the controllable switch 10. When in the second position shown by shadow line 14, the controllable switch 10 connects the scaled output $V_{o2}/N_2$ to the input 21 of the phase detector 20.

In operation, the signal sensing circuit 8 detects the presence or absence of the signal $V_{ref}$ and controls the position of switch 10, accordingly. If $V_{ref}$ is sensed as present, the signal sensing circuit 8 causes the switch 10 to be in the first position connecting $V_{ref}$ to the input 21 of phase detector 20. Upon sensing an interruption or loss of $V_{ref}$, the signal sensing circuit 8 causes switch 10 to operate in the second position connecting the scaled output signal $V_{o2}/N_2$ to the input 21 of phase detector 20.

When the incoming reference signal $V_{ref}$ is present and applied to the phase detector 20, the phase detector 20 measures the phase difference of $V_{ref}$ and the scaled signal $V_o/N_1$ applied to its input terminal 22. Phase detector 20 generates an output error signal $V_E$ based on the measured phase difference of its two input signals. The error signal $V_E$ is then filtered by loop filter 30 to eliminate any high frequency noise to produce an output signal $V_{FE}$ and the $V_{FE}$ output signal is applied to the control terminal of the governable oscillator 40. This signal controls the output $V_o$ of the governable oscillator 40 to eliminate any phase difference between $V_o/N_1$ and $V_{ref}$. Thus, within circuit 1, the phase detector 20, loop filter 30, governable oscillator 40 and frequency divider 50 comprise a primary PLL circuit 3 shown encompassed by a broken outline in FIG. 1.

Likewise, within circuit 1, the phase detector 60, loop filter 70, governable oscillator 80 and frequency divider 90 circuit elements comprise a secondary PLL circuit 4 also shown encompassed by a broken outline in FIG. 1. The phase detector 60 generates an output error signal $V_{E2}$ based on the phase difference between its input signals $V_o/N_1$ and $V_{o2}/N_2$. The error signal $V_{E2}$ is filtered by filter 70 to produce output signal $V_{FE2}$ which controls the governable oscillator 80 such that its output signal $V_{o2}$ is phase-locked to $V_o$.

Upon loss of the reference signal $V_{ref}$, the signal sensing circuit 8 causes switch 10 to enter its second position causing circuit 1 to enter a holdover mode wherein the signal $V_{o2}/N_2$ is applied to the input terminal 21 of phase detector 20. In the holdover mode, $V_o$ of the primary PLL 3 will be phase-locked to the output signal $V_{o2}/N_2$ of the secondary PLL 4. When restoration of the reference clock signal is detected by signal sensing circuit 8, switch 10 is caused to reconnect the incoming reference signal $V_{ref}$ to the phase detector 20.

Thus, when the incoming reference signal $V_{ref}$ is present, the primary loop 3 phase-locks its output $V_o$ based on $V_{ref}$ and when $V_{ref}$ is interrupted or absent, the output $V_o$ is phase-locked on the scaled output signal $V_{o2}/N_2$ of the secondary PLL 4.

Although secondary PLL 4 operates in the same manner as primary PLL 3, the circuit elements of secondary PLL 4 should be selected so as to produce an extremely stable output signal $V_{o2}$. It is preferable that the governable oscillator 80 of the secondary PLL 4 be inherently stable so that its output $V_{o2}$ would be substantially unlikely to drift in the absence of the incoming reference signal $V_{ref}$. An example of an inherently stable device suitable for the governable oscillator 80 is a temperature-compensated crystal oscillator.

The stability of the secondary PLL 4 is further enhanced by selecting a very small loop bandwidth which is determined by the bandwidth of loop filter 70. For example, when the center frequency of governable oscillator 80 is on the order of 8 MHz, the bandwidth of the secondary PLL 4 should be on the order of milli-hertz (mHz). Utilizing a loop filter 70 with such a low cut-off frequency ensures a slow response to input anomalies by the secondary PLL 4. In other words, the small loop bandwidth causes the output of secondary PLL 4 to not be drastically effected by recent input anomalies.

Typically, a suitable inherently stable governable oscillator 80 for the secondary PLL 4 will have a substantially different center frequency than the desired output frequency $V_o$ for the circuit 1. Therefore, in order to produce a hitless switchover, the governable oscillators 40 and 80 having output center frequencies $f_o$ and $f_{o2}$, respectively, and the frequency divider values $N_1$ and $N_2$ should be chosen according to the relationship: $f_{ref}=f_o/N_1=f_{o2}/N_2$. This relationship states that $f_o$ and $f_{o2}$ must be multiples of $f_{ref}$. Thus, in the circuit 1 adhering to this relationship, when $V_{ref}$ has been interrupted, the input 22 of phase detector 20 merely switches from $V_{ref}$ to $V_{o2}/N_2$, a stable signal that is equal in frequency to $V_{ref}$.

The primary and secondary PLLs 3 and 4 may be of digital or analog design, depending on the application. Digital PLLs are more suitable for synchronization of digital signals, clock recovery from encoded data streams, and other digital applications. Analog PLLs are more suitable in non-digital communication systems since they maintain linear relationships between input and output quantities.

One contemplated embodiment of the present invention utilizes PLL's for generation of a local clock signal to provide synchronization of digital signals in a receiver within a telecommunications system. An example of this embodiment may have a reference signal frequency equal to 64 kHz, $f_{ref}$=64 kHZ. Further, it is envisioned that the desired output signal $V_o$ may have a frequency of 31.104 MHz, $f_o$=31.104 MHz, and an inherently stable oscillator with an available center-frequency, $f_{O2}$, equal to 8.192 MHz. Therefore, $N_1$ must equal 486 and $N_2$ must equal 128 in order to satisfy the relationship:

$$f_{ref}=f_o/N_1=f_{o2}/N_2=64 \text{ KHZ}=31.104 \text{ MHZ}/486=8.192 \text{ MHZ}/128.$$

The circuit elements utilized for the 31.104 MHz (31 MHz) primary PLL 3 can be any known conventional PLL circuit elements. The transfer functions for the elements of the loop should be selected to produce a Bessel-type response to produce a substantially constant time delay in the loop for a large range of frequencies. Further details of a suitable digital phase detector circuit 20 for use in the primary PLL 3 for 31 MHz operation is illustrated in FIG. 2.

Figure 2:
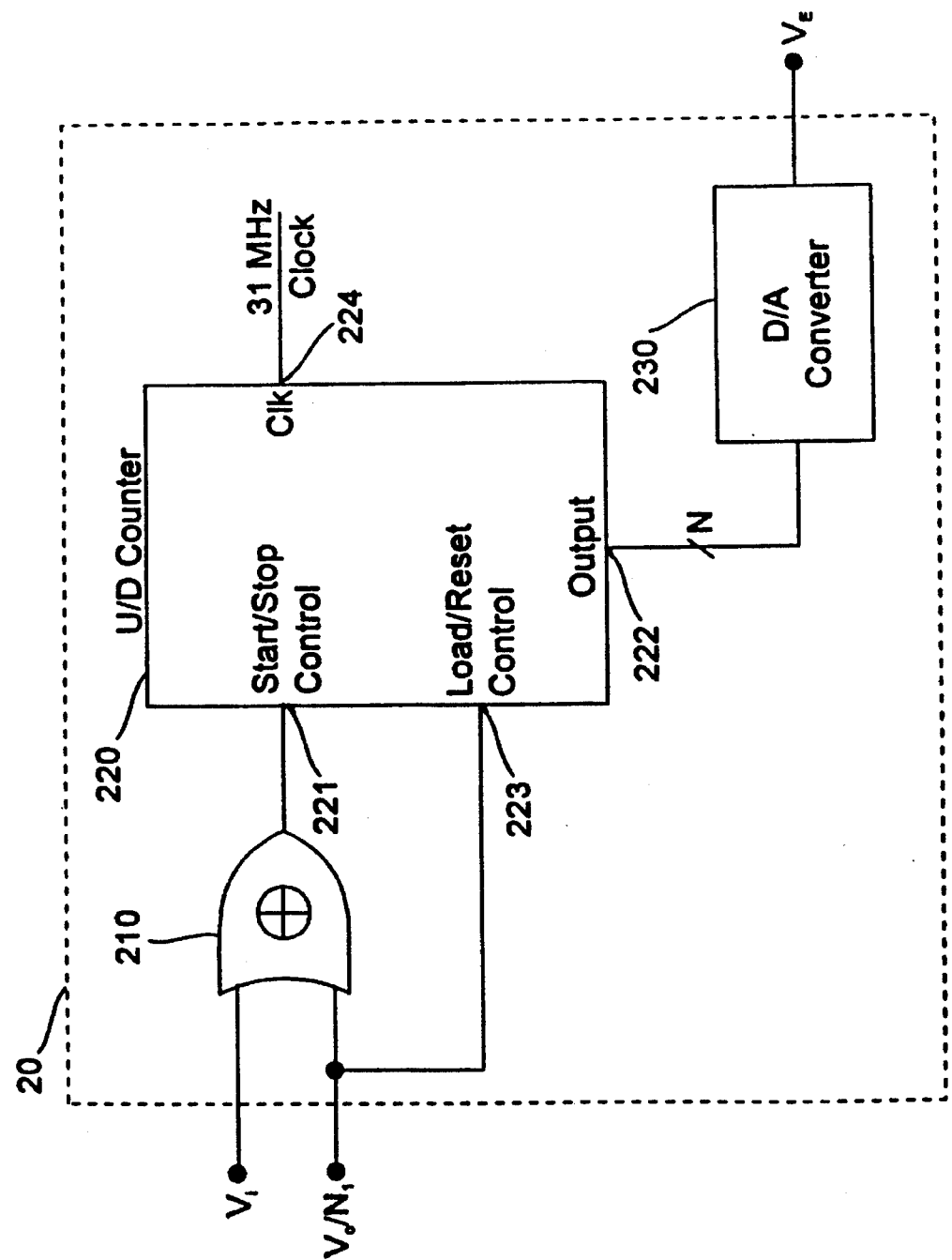
FIG. 2 is a schematic diagram of a phase detector which may be used in the primary loop of the phase-locked loop circuit of FIG. 1.

Referring to the phase detector 20 of FIG. 2, the scaled output signal $V_o/N_1$ of primary PLL 3 and a signal $V_i$ are applied to an exclusive OR ("XOR") gate 210. The signal $V_i$ corresponds to $V_{ref}$ or the scaled output signal $V_{o2}/N_2$ of secondary PLL 4 depending on the position of the switch 10 in FIG. 1. The XOR gate 210 is connected to a start/stop control terminal 221 of an up/down counter 220 which has an n-bit wide digital count output 222. The $V_o/N_1$ signal is also applied to a load/reset control 223 of the counter 220, and a 31 MHz signal is applied to the clock terminal 224 of counter 220. The n-bit wide output 222 of counter 220 is connected to a digital-to-analog ("D/A") converter 230. The D/A converter 230 generates an analog $V_E$ signal which corresponds to the phase difference of the signals $V_o/N_1$ and $V_i$.

The phase detector 20 measures the phase difference of the inputs $V_i$ and $V_o/N_1$ by determining the time period between the rising edges within each cycle of these input signals. If the phase of $$|V_i - (V_0/N_1)| = \frac{\pi}{2}$$

radians, the output count will be zero. The counter may be reset to a value other than zero to take into account the inherent $$\frac{\pi}{2}$$

radian phase difference of the phase detector 20.

In operation, at the rising edge of the signal at $V_o/N_1$, the load/reset control 223 resets the counter to its initial value. If at that time, $V_i$ is low, or upon $V_i$ going low, the output of XOR gate 210 will go high causing the counter 220 to start counting. At the next rising edge of the signal $V_o/N_1$ or $V_i$, the output of XOR gates 210 will go low causing the counter 220 to stop counting. Then at the next rising edge of $V_o/N_1$, counter 220 will perform two substantially simultaneous operations: (1) generate an n-bit wide number at its output 222 corresponding to the count obtained, and (2) reset the counter to its initial value. The digital number at output 222 corresponds to the time delay between the rising edges of $V_i$ and $V_o/N_1$. The time difference between the rising edges of these signals corresponds to the phase difference between the two signals. The D/A converter 230 converts the digital output count of counter 220 to an analog voltage $V_E$.

The resolution of the counter 220, or the rate at which counter 220 counts, is based on the signal at the clock input 224, which is 1/(2×clock frequency)=1/(2×31 MHz)=approximately 16 ns. A resolution of 16 ns is more than sufficient to monitor a 64 kHz signal having a cycle period of approximately 16 µs.

Referring to FIG. 2, if the component selected for D/A converter 230 has an offset voltage at its output, the initial value loaded into up/down counter 220 of phase detector 20 may be adjusted to compensate for the offset. An alternative way to account for any offset voltage of D/A converter 230 is to utilize the filter circuit 30 of FIG. 3.

Figure 3:
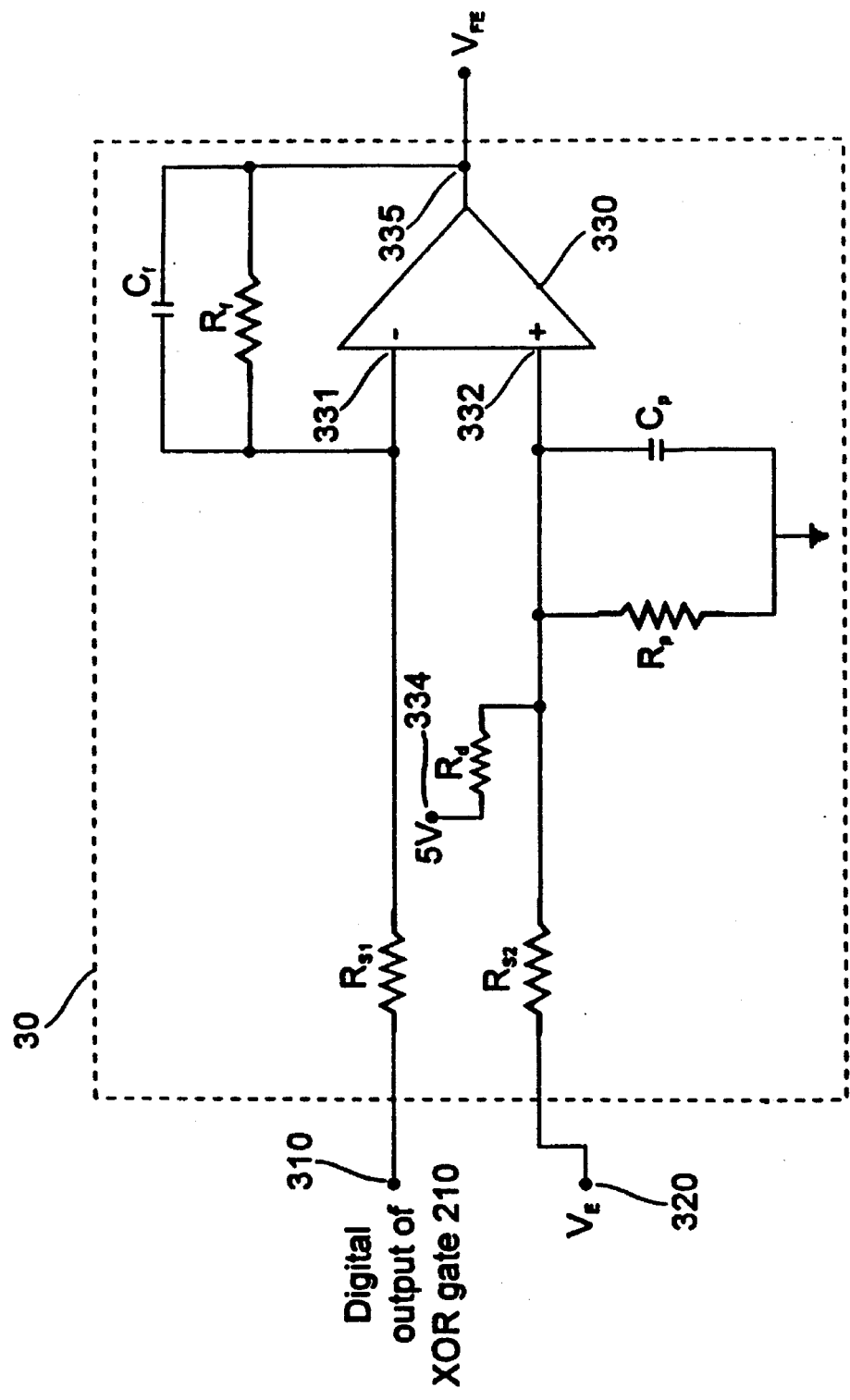
FIG. 3 is a schematic diagram of an embodiment of a filter circuit suitable for use in the primary loop of the phase-locked loop circuit of FIG. 1.

FIG. 3 illustrates further details of a suitable loop filter circuit for use as the loop filter 30 of FIG. 1. Referring to FIG. 3, the filter circuit 30 has two inputs 310 and 320. The error signal $V_E$ from the phase detector 20 of FIG. 2 is applied to the input 320, and the output of XOR gate 210 of phase detector 20 is applied to the input 310. Within filter circuit 30, input 310 is connected to a series resister $R_{S1}$ which is connected to a negative input of an operational amplifier ("op-amp") 330. The negative input 331 of op-amp 330 is also connected to an output 335 of op-amp 330 by a parallel combination of a filter capacitor $C_f$ and a filter resistor $R_f$.

Input 320 of the filter circuit 30 is connected to a series resister $R_{S2}$ which is connected to a positive input 332 of op-amp 330 and to ground via a parallel combination of resistor $R_p$ and capacitor $C_p$. The positive input 332 of op-amp 330 is also connected to a 5 V power source 334 via resister $R_d$. The signal at the output 335 of the op-amp 330 is the filtered error signal $V_{FE}$.

In operation, the filter circuit 30 of FIG. 3 will remove an offset voltage of the D/A converter 230 and proportionately scale the D/A converter 230 output signal $V_E$ to a range suitable for input to the governable oscillator 40. With the component values $R_p=R_d=10k\Omega$, $C_f=33$ nF, $R_{S2}=1M\Omega$ and $R_f=21.5K\Omega$, the filter circuit 30 of FIG. 3 will eliminate an offset voltage of 0.27V of D/A converter 230, and proportionally scale a D/A converter 230 output signal $V_E$ operating in a range of 0 to 5 V to a filtered $V_{FE}$ signal operating in the range of 1.5 to 3.5 V, which is suitable to control a typical VCXO.

Figure 4:
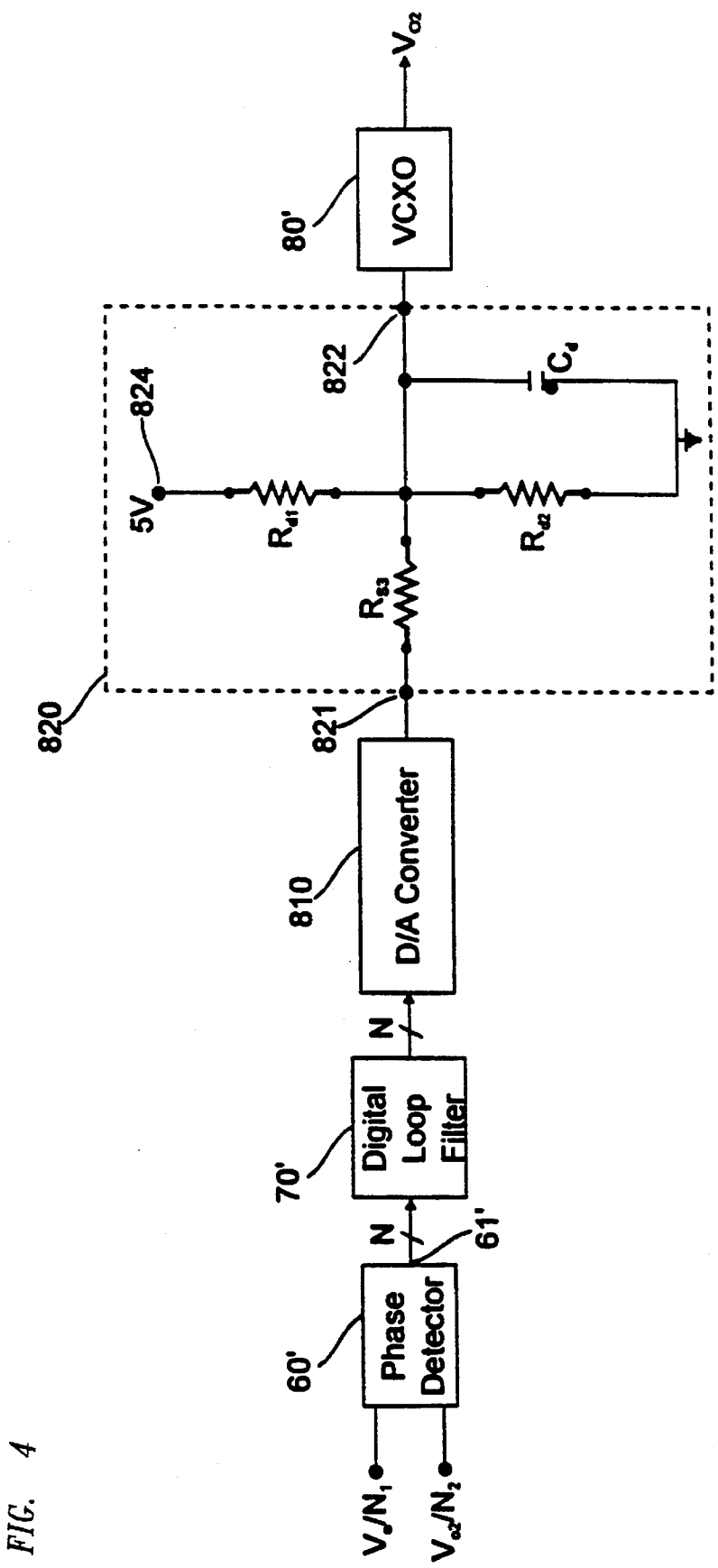
FIG. 4 is a schematic diagram of a control circuit for a voltage controlled crystal oscillator which may suitably be used in the secondary loop of the phase-locked loop circuit of FIG. 1.

Referring to the secondary PLL 4 of FIG. 1, if a reduction of hardware is desired, the circuit 800 of FIG. 4 may be used. In FIG. 4, similar component blocks to those of FIG. 1 are indicated with a'. For example, phase detector 60' corresponds generally to phase detector 60. The signals $V_o/N_1$ and $V_{o2}/N_2$ are applied to a phase detector 60' having an n-bit wide digital output 61' which is filtered through a digital loop filter 70' and applied to a D/A counter 810. The D/A converter 810 is connected to an input 821 of a control circuit 820 which acts as a voltage divider circuit.

Within control circuit 820, the input terminal 821 is connected to an output terminal 822 via a series resistor $R_{S3}$. The output terminal 822 is also connected to a 5 V power source 824 by a resister $R_{d1}$, and to ground via a parallel combination of a resistor $R_{d2}$, and a capacitor $C_d$. The output 822 of control circuit 820 is connected to VCXO 80' which generates the secondary PLL 4 output signal $V_{o2}$.

A digital loop filter 70' was selected for the circuit of FIG. 4 because in the current state of the art it is very difficult to produce an analog low pass filter with a cut-off frequency in the milli-hertz range. An envisioned circuit for the phase detector 60' having an n-bit wide output is substantially identical to the circuit for the phase detector 20' in FIG. 2 with the D/A converter 230 eliminated. In such a circuit, the n-bit wide count output of counter 220 would be a digital signal equivalent to the analog $V_E$ signal shown in FIG. 2. Digital $V_E$ would then be applied to a digital loop filter such as loop filter 70' shown in FIG. 4.

A conventional single pole low-pass filter with the desired small bandwidth would be a suitable one for use as digital loop filter 70'. The filtered digital $V_E$ is then converted to an analog filtered $V_E$ signal by D/A converter 810. The control circuit 820 scales the D/A converter 810 output to an acceptable range for a governable oscillator 80', such as a VCXO as is shown in FIG. 4.

When $R_{S3}$, $R_{d1}$ and $R_d$ and in the ratio $R_{S3}=3$ R and $R_{d1}=R_{d2}=4$ R, where the value R is a resistance multiplying factor, the control circuit 820 will scale an input signal having a range of 0 to 5 V to a corresponding signal in the range of 1.5 to 3.5 V. The value of capacitor $C_d$ should be selected in order to filter out any high frequency noise from the signal at input 821.

To obtain the desired stability of the secondary PLL 4, a suitable transfer constant for an 8.192 MHz VCXO used as the governable oscillator 80' is 5 ppm/V. If the desired resolution of the PLL circuit 5 is ±0.01 ppm, then output of the digital filter 70' and phase detector 60' must be at least 9 bits wide.

$$\frac{5 \text{ ppm}}{0.01 \text{ ppm}} = 500 \text{ steps,}$$

which is covered by 9 bits.

Figure 5:
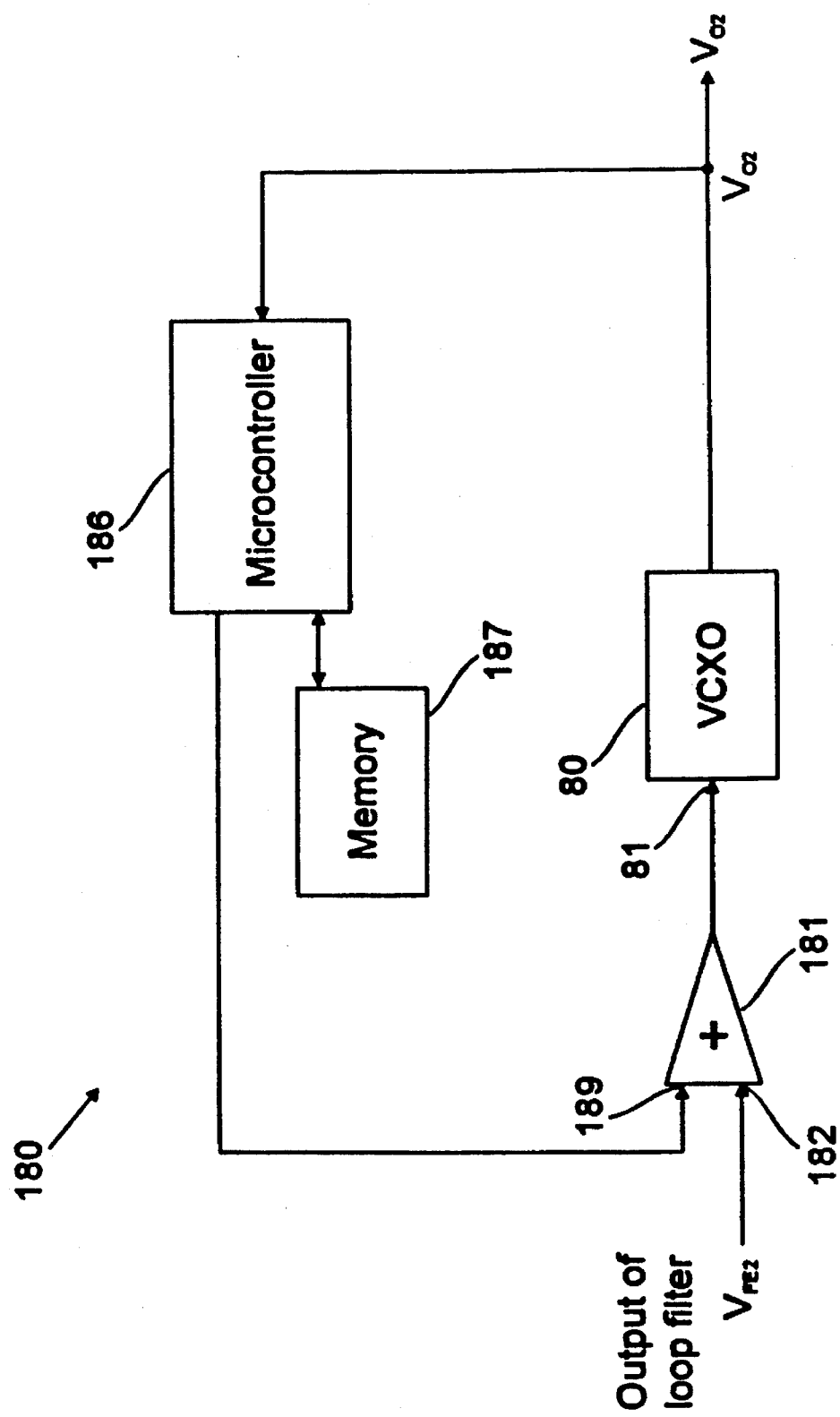
FIG. 5 is a schematic diagram of a correction circuit for a governable oscillator which may suitably be used in the secondary loop of the phase-locked loop of FIG. 1.

Another embodiment of the present invention, shown in FIG. 5, substantially improves the invariable response by secondary PLL 4 to input anomalies. FIG. 5 depicts a correction circuit 180 which significantly minimizes the possibility that secondary PLL 4 will generate the output signal $V_{o2}$ based on an input signal $V_o$ in a runaway condition. When the reference signal $V_{ref}$, to which the primary PLL 3 is phase-locked, is interrupted causing the circuit to switch over to the scaled output signal $V_{o2}/N_2$, the primary PLL 3 may develop an extreme situation starting a frequency runaway. Immediately after a runaway condition has commenced, the frequency of the output signal $V_{o2}$ would slowly and incrementally follow that of the runaway signal $V_o$ because the secondary PLL 4 phase-locks its output signal $V_{o2}$ on the scaled signal $V_o/N_1$. Thereby, after switchover, the $V_{o2}$ output of the secondary PLL 4 would have a frequency somewhat different than that of the reference signal $V_{ref}$. Thus, an undesirable result could occur in the holdover mode because the primary PLL 3 may lock on to the deviated $V_{o2}$ frequency of the secondary PLL 4.

The correction circuit 180 of FIG. 5 is a suitable circuit for the prevention of drift of the output signal $V_{o2}$ when the primary PLL 3 enters a runaway condition. Referring to FIG. 5, the output signal $V_{FE2}$ of a the loop filter 70 (shown in FIG. 1) is applied to a first input 182 of a voltage summer 181. The voltage summer 181 is connected to the control terminal 81 of the governable oscillator 80. The governable oscillator 80 generates the output signal $V_{o2}$ of the secondary loop 4 of FIG. 1. The oscillator output signal $V_{o2}$ is applied to a microcontroller 186 which is connected to a memory device 187. Microcontroller 186 generates a correction signal $V_c$ which is applied to a second input 189 of the voltage summer 181.

In operation, the microcontroller 186 samples the frequency of the governable oscillator output signal $V_{o2}$ at given time intervals over a substantial period of time and stores the sampled frequency values in the memory device 187. The microcontroller 186 then generates the correction signal $V_c$ using a suitable algorithm based on the sampled values stored in the memory device 187. The algorithm may be based on an average of the sampled frequencies or other best-fit latest frequency techniques. A suitable routine for generating the correction signal $V_c$ is shown in FIG. 6.

The correction signal $V_c$ is summed with the loop filter output $V_{FE2}$ to produce a signal which controls the output signal of governable oscillator 80. The correction circuit 180 generates the correction signal $V_c$ based on the output signal $V_{o2}$ over a substantially long period of time. For example, the VCXO output $V_{o2}$ may be sampled once per minute for five hours and if the memory device 187 has 300 storage locations the generated correction signal would be based on the output signal $V_{o2}$ for the previous five hours. Further, sampling the output signal $V_{o2}$ for upwards of five hours would utilize a sufficiently long history signal so as to make that signal negligibly effected by a recent runaway condition of the primary loop circuit 3.

Figure 6:
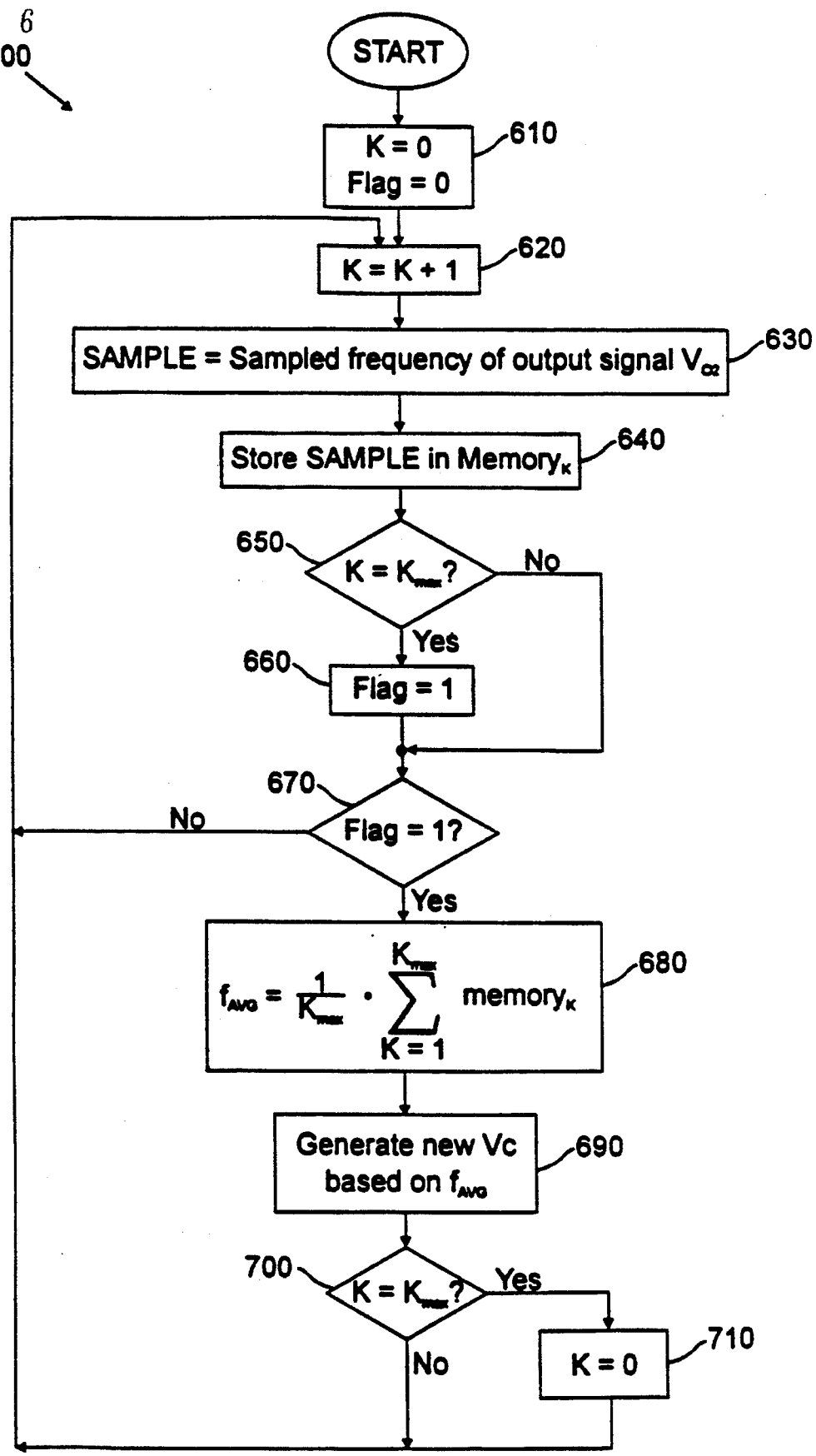
FIG. 6 is a flow diagram of a suitable routine which may be implemented in the correction circuit of FIG. 5.

FIG. 6 is a flow diagram 600 for a suitable algorithm to be used in the microcontroller 186 of FIG. 5. Referring to FIG. 6, initially values K and FLAG are reset to zero in step 610. The value K is incremented in step 620. The frequency of the output signal $V_{o2}$ is sampled in step 630, and a corresponding frequency value is stored in location K of memory device 187 in step 640.

In step 650, if K is detected equal to $K_{max}$, then the value FLAG is set to one in step 660 before the routine proceeds to step 670. In step 670, the value FLAG is tested and if FLAG is not equal to one, the routine reverts back to step 620 where K is incremented. In the alternative, if the FLAG value equals one, then in step 680 a frequency average, $f_{avg}$, is taken of the frequency values stored in memory device 187. In step 690, a new correction voltage $V_c$ is then generated based on the average of the sampled frequency. In step 700, K is tested and if it is equal to $K_{max}$, K is reset to zero in step 710 before the routine reverts back to step 620.

This routine 600 generates a new correction voltage $V_c$ based on a rolling average of the sampled frequencies. Steps 650–670 merely ensure that a substantial number of samples are taken before any correction voltage $V_c$ is generated. This sequence is performed at specified time intervals, e.g., once per minute, over a substantial period of time to utilize the desired amount of history of the output signal $V_{o2}$.

While the invention has been described in terms of a specific implementation for the primary PLL 3 and secondary PLL 4, it should be apparent that the present invention can be constructed using other digital or analog PLL loop configurations.

I claim:

1. A frequency synthesizer circuit for generating a phase-locked local clock signal without interruption based on a reference clock signal that may be interrupted, the circuit comprising:

a primary phase-locked loop circuit with an input and an output, the local clock signal being generated at the output;

a secondary phase-locked loop circuit with an input and an output, the input being connected to the output of the primary loop, the secondary phase-locked loop generating a highly stable scaled output signal of substantially minimal frequency variation that is substantially equal in frequency and substantially in phase with the reference clock signal, wherein the secondary phase-locked loop output signal is partly based on frequency samples over a period of time of the secondary loop output signal; and a switch adaptable for connecting the input of the primary loop to the reference clock signal or to the output of the secondary loop, wherein the switch operates in a first position to provide the input of the primary loop with the reference clock signal when the reference clock signal is present and wherein the switch operates in a second position to connect the primary loop circuit input to the output of the secondary loop when the reference clock signal is interrupted or absent.

2. The circuit of claim 1, wherein each of the primary phase-locked loop and secondary phase-locked loop comprises:

a phase detector having first and second inputs and an output, the first input being the input of the loop, wherein an error signal is generated at its output corresponding to a difference in phase of the signals at its inputs;

a loop filter having an input and an output, the input being connected to the output of the phase detector;

a governable oscillator having a center frequency, a control terminal and an output, the control terminal being connected to the output of the filter and the oscillator output being the output of the loop; and a frequency divider having an input and an output, the input being connected to the output of the governable oscillator and the divider output being connected to the second input of the phase detector.

3. The circuit of claim 2, wherein the center frequencies of the governable oscillators of the primary and secondary loops are a multiple of the reference clock frequency.

4. The circuit of claim 2, wherein the loop filter of the secondary loop has a narrow bandwidth.

5. The circuit of claim 2, wherein the phase detector of the primary loop comprises:

an exclusive OR gate with first and second inputs and an output, the first input being the input to the primary loop and the second input being connected to the output of the governable oscillator of the primary loop;

a counter having a start/stop terminal, a reset terminal and a digital output, the start/stop terminal being connected to the output of the exclusive OR gate and the reset terminal being connected to the output of the governable oscillator of the primary loop; and a digital-to-analog converter with a digital input and an analog output, the digital input being connected to the output of the counter and the analog output being connected to the loop filter of the primary loop.

6. The circuit of claim 2, wherein the loop filters are low pass filters.

7. The circuit of claim 2, wherein the governable oscillators of the primary and secondary loops are voltage-controlled crystal oscillators.

8. The circuit of claim 2, wherein the phase detector of the secondary loop has a digital output corresponding to the phase difference of its inputs and wherein the loop filter of the secondary loop is a digital filter.

9. The circuit of claim 8, wherein the phase detector of the secondary loop comprises:

an exclusive OR gate with first and second inputs and an output, the first input being the input of the secondary loop and the second input being connected to the output of the governable oscillator of the secondary loop; and a counter having a start/stop terminal, a reset terminal and a digital count output, the start/stop terminal being connected to the output of the exclusive OR gate, the reset terminal being connected to the output of the governable oscillator of the secondary loop, and the digital count output being the output of the phase detector.

10. The circuit of claim 9, further comprising:

a digital to analog converter having an input and an output, the input being connected to the output of the digital filter and the output being connected to the control terminal of the governable oscillator.

11. The circuit of claim 2, further comprising:

a signal scaling circuit connected to the control terminal of the governable oscillator, wherein the signal scaling circuit proportionately scales the amplitude of the filtered error signal to within input range limitations of the governable oscillator.

12. The circuit of claim 2, wherein the filter compensates for an offset voltage of the phase detector.

13. The circuit of claim 1, wherein the phase-locked output of the secondary loop is based on a running average of the frequency samples.

14. The circuit of claim 1, wherein the switch is a controllable switch and wherein the circuit further comprises:

a signal sensing circuit adapted to receive the reference signal, the signal sensing circuit being connected to the controllable switch such that when the reference signal is sensed present, the signal sensing circuit causes the switch to be in the first position and when the reference signal is sensed absent, the switch is caused to be in the second position.

15. A method for generating a phase-locked clock signal based on a reference clock signal comprising:

generating a primary phase-locked local clock signal based on the reference clock signal;

generating a highly stable scaled secondary phase-locked clock signal of substantially minimal frequency variation that is substantially equal in frequency and substantially in phase with the reference signal, the scaled phase-locked clock signal being based on the primary phase-locked local clock signal and on frequency samples over a period of time of the secondary phase-locked clock signal;

switching the basis of the primary local clock signal from the reference clock signal to the secondary clock signal when the reference clock signal is interrupted for reducing the liklihood of a frequency runaway condition of said primary phase-locked local clock signal.

16. The method of claim 15, further comprising:

switching the basis of the first local clock signal back to the reference clock signal from the second local clock signal when the reference clock signal is reestablished.

17. The circuit of claim 2, wherein the governable oscillator of the secondary loop circuit is a highly stable governable oscillator.

18. The circuit of claim 4, wherein the loop bandwidth is on the order of milihertz when a frequency of the local clock signal is on the order of megahertz.

19. The circuit of claim 13, wherein a rate of sampling the signal is on the order of minutes and the period of time is on the order of hours.

20. The circuit of claim 19, wherein the stable governable oscillator of the secondary loop circuit is a temperature-compensated crystal oscillator.

21. The circuit of claim 13, further comprising a processing unit being connected to the secondary loop output, and being operably connected to the governable oscillator of the secondary phase-locked loop circuit, wherein the processing unit samples the output signal and provides a corresponding correction signal to the governable oscillator based on the sampled signal.

22. The circuit of claim 21, wherein the processing unit is operably connected to the oscillator by a summing circuit which is also connected to the secondary loop filter output.

23. The method of claim 15, further comprising:

determining a running average of the frequency samples; and basing the generating of the second phase-locked clock signal on the primary phase-locked local clock signal and the running average.

24. A frequency synthesizer circuit comprising:

a primary phase-locked loop circuit with an input and an output, the local clock signal being generated at the output;

a secondary phase-locked loop circuit with an input and an output, the input being connected to the output of the primary loop, the secondary loop circuit having a substantially narrow loop bandwidth compared to the primary loop circuit, wherein the secondary loop circuit generates a highly stable scaled output signal of substantially minimal frequency variation that is substantially equal in frequency and substantially in phase with the reference signal; and a switch adaptable for connecting the input of the primary loop circuit to the reference clock signal or to the output of the secondary loop circuit, wherein the switch operates in a first position to provide the input of the primary loop circuit with the reference clock signal when the reference clock signal is present and wherein the switch operates in a second position to connect the primary loop circuit input to the output of the secondary loop circuit when the reference clock signal is interrupted, reducing the liklihood of a frequency runaway condition of said local clock signal.

25. The circuit of claim 24 wherein the loop bandwidth of the secondary phase-locked loop is on the order of millihertz when a frequency of the local clock signal is on the order of megahertz.

* * * * *